(12) United States Patent
Lee et al.

(10) Patent No.: US 7,723,217 B2
(45) Date of Patent: May 25, 2010

(54) METHOD FOR MANUFACTURING GALLIUM NITRIDE SINGLE CRYSTALLINE SUBSTRATE USING SELF-SPLIT

(75) Inventors: Ho-Jun Lee, Daegu (KR); Doo-Soo Kim, Seoul (KR); Dong-Kun Lee, Gumi-si (KR); Yong-Jin Kim, Gumi-si (KR)

(73) Assignee: Siltron Inc., Gumi (KR)

( * ) Notice: Subject to any disclaimer, the term of this patent is extended or adjusted under 35 U.S.C. 154(b) by 0 days.

(21) Appl. No.: 12/332,198

(22) Filed: Dec. 10, 2008

(65) Prior Publication Data

US 2009/0155986 A1    Jun. 18, 2009

(30) Foreign Application Priority Data

Dec. 12, 2007    (KR) .................. 10-2007-0129269

(51) Int. Cl.
*H01L 21/20*    (2006.01)
(52) U.S. Cl. .................. 438/483; 257/E21.097; 257/E21.101
(58) Field of Classification Search .................. 438/483; 257/E21.097, E21.101, E21.085, E21.098, 257/E21.099
See application file for complete search history.

(56) References Cited

U.S. PATENT DOCUMENTS

2002/0182889 A1    12/2002    Solomon et al.
2006/0108573 A1 *  5/2006     Lee et al. .................. 257/11
2008/0067543 A1    3/2008     Shin et al.

FOREIGN PATENT DOCUMENTS

| EP | 1 528 591 A2 | | 5/2005 |
|----|---|---|---|
| GB | 2378317 A | * | 5/2003 |
| JP | 2002-211999 | | 7/2002 |
| JP | 2002-289491 | | 10/2002 |
| KR | 10-2002-37903 | | 3/2002 |

OTHER PUBLICATIONS

K. Tomita et al., "Self-Separation of Freestanding GaN from Sapphire Substrates by Hydride Vapor Phase Epitaxy," Phys. Stat. Sol. (a) 194, No. 2, 563-567. Jul. 2002.

* cited by examiner

*Primary Examiner*—Caridad M Everhart
(74) *Attorney, Agent, or Firm*—Greer, Burns & Crain, Ltd.

(57) ABSTRACT

The present invention relates to a method for manufacturing a gallium nitride single crystalline substrate, including (a) growing a gallium nitride film on a flat base substrate made of a material having a smaller coefficient of thermal expansion than gallium nitride and cooling the gallium nitride film to bend convex upwards the base substrate and the gallium nitride film and create cracks in the gallium nitride film; (b) growing a gallium nitride single crystalline layer on the crack-created gallium nitride film located on the convex upward base substrate; and (c) cooling a resultant product having the grown gallium nitride single crystalline layer to make the convex upward resultant product flat or bend convex downwards the convex upward resultant product and at the same time to self-split the base substrate and the gallium nitride single crystalline layer from each other at the crack-created gallium nitride film interposed therebetween.

15 Claims, 3 Drawing Sheets

(a)

(b)

(c)

(d)

(a)           (b)

(a)                    (b)

METHOD FOR MANUFACTURING GALLIUM NITRIDE SINGLE CRYSTALLINE SUBSTRATE USING SELF-SPLIT

FIELD OF THE INVENTION

The present invention relates to a method for manufacturing a free-standing gallium nitride single crystalline substrate, which grows a gallium nitride (GaN) single crystal on a base substrate and splits the grown gallium nitride single crystal from the base substrate to obtain a free-standing gallium nitride single crystalline substrate.

BACKGROUND OF THE INVENTION

Gallium nitride (GaN) is a nitride semiconductor having wurzite structure, and has a direct transition type band gap of 3.4 eV corresponding to a blue wavelength range in visible light at room temperature, forms a homogeneous solid solution with InN and AlN to control a forbidden bandwidth, and exhibits characteristics of a direct transition type semiconductor in the entire composition range of a homogeneous solid solution. Thus, GaN is used the most widely as a material for a blue displaying and light emitting device.

Generally, a GaN single crystal is formed on a base substrate made of sapphire ($Al_2O_3$), silicon carbide (SiC) or silicon (Si) by metal organic chemical vapor deposition (MOCVD) or hydride vapor phase epitaxy (HVPE). However, the base substrate and a GaN film have different lattice constants and coefficients of thermal expansion, and thus a lattice mismatch makes it difficult to grow epitaxially the GaN film on the base substrate.

To overcome the problem, a technique was suggested to form a buffer layer having a similar lattice constant on a base substrate at a relatively low temperature and grow a GaN single crystalline layer on the buffer layer in order to relieve a lattice strain. However, this technique needs a high-cost base substrate and a growth apparatus for forming a buffer layer. And, this technique can grow epitaxially a GaN single crystalline layer, but exhibits a high dislocation density in the GaN single crystalline layer, and thus has limitations in application to a laser diode or an emitting diode.

According to modern technology, a GaN single crystalline layer can be formed on a sapphire base substrate relatively easily, but the GaN single crystalline layer should be split from the sapphire base substrate to obtain a free-standing GaN single crystalline substrate.

Splitting of a GaN single crystalline layer from a sapphire base substrate uses mechanical polishing or laser lift-off of the sapphire base substrate. The mechanical polishing polishes a sapphire base substrate to make the sapphire base substrate thinner, which results in destruction of an equilibrium reached immediately after growth of a GaN single crystalline layer, and consequently creation of cracks in the sapphire base substrate. The cracks propagate to the GaN single crystalline layer, which makes it difficult to obtain a high-quality large-area GaN single crystalline substrate. Meanwhile, the laser lift-off irradiates an ultraviolet laser on a sapphire base substrate to thermally decompose gallium nitride into gallium and nitrogen at an interface between the sapphire base substrate and a GaN single crystalline layer. However, the laser lift-off has disadvantages of long time and a low yield.

Alternatively, a silicon substrate may be used as a base substrate. This method can produce a large-area substrate at a low cost, and selectively etch and remove a silicon base substrate only. Thus, advantage is easier splitting of a substrate than use of a sapphire base substrate. However, it is still difficult to grow a GaN layer on a silicon base substrate, and the silicon base substrate may be etched during growth of the GaN layer. Further, although a GaN layer is grown on a silicon base substrate, bending and cracks may occur to the silicon base substrate due to differences in coefficient of thermal expansion and lattice constant between the silicon base substrate and the GaN layer.

SUMMARY OF THE INVENTION

Therefore, the present invention is designed to solve the above-mentioned problems, and therefore it is an object of the present invention to provide a method for manufacturing a gallium nitride single crystalline substrate, which enables an easy splitting of a gallium nitride single crystalline layer from a base substrate and production of a large-area substrate.

In order to achieve the above-mentioned objects, the present invention does not use a buffer layer for absorbing differences in coefficient of thermal expansion and lattice constant between a base substrate material and GaN, but actively utilizes a difference in coefficient of thermal expansion between a base substrate material and GaN to bend the base substrate and create cracks in a GaN film. During a cooling process, a GaN single crystalline layer grown on the crack-created GaN film and the base substrate are split naturally from each other.

That is, a method for manufacturing a gallium nitride single crystalline substrate according to an aspect of the present invention includes (a) growing a gallium nitride film on a flat base substrate made of a material having a smaller coefficient of thermal expansion than gallium nitride and cooling the gallium nitride film to bend convex upwards the base substrate and the gallium nitride film and at the same time to create cracks in the gallium nitride film; (b) growing a gallium nitride single crystalline layer on the crack-created gallium nitride film located on the convex upward base substrate; and (c) cooling a convex upward resultant product having the grown gallium nitride single crystalline layer to make the convex upward resultant product flat or bend convex downwards the convex upward resultant product and at the same time to self-split the base substrate and the gallium nitride single crystalline layer from each other at the crack-created gallium nitride film interposed therebetween.

Preferably, in the step (a), the gallium nitride film is grown to a thickness between 2.5 μm and 3.5 μm by MOVCD (Metal Organic Chemical Vapor Deposition).

Preferably, the cracks created in the gallium nitride film in the step (a) run parallel to a surface of the base substrate or slantly relative to the surface of the base substrate.

Preferably, in the step (b), the gallium nitride single crystalline layer is grown to a thickness between 50 μm and 300 μm by HVPE (Hydride Vapor Phase Epitaxy).

Preferably, the step (b) is performed at temperature between 990° C. and 1030° C.

Preferably, the base substrate is silicon or silicon carbide, and more preferably silicon having a plane orientation of {111}.

Meanwhile, Korean Laid-Open Patent Publication No. 2007-31249 discloses a method for manufacturing a gallium nitride single crystalline thick layer. This method manufactures a high-quality GaN single crystalline thick layer free of bending and cracks by obtaining a stack of a crack-induced base substrate and a GaN film and growing a GaN thick layer. This method has distinction from the present invention as follows. First, this method uses a sapphire substrate as a base substrate, not a silicon substrate that the present invention uses as a base substrate. And, this method induces cracks, not for self-splitting as in the present invention, but for relieving and removing stress at an interface of the stack of the base substrate and the GaN film. That is, this method induces cracks to the GaN film and propagates the cracks to the sapphire base substrate beneath the GaN film, and splits a substrate by a conventional substrate splitting technique using laser. Further, this method grows the crack-induced GaN film and the GaN single crystalline thick layer by HVPE, and induces cracks to a GaN film grown at temperature between 930° C. and 1000° C., and after cooling a process temperature down to 400° C. to propagate the cracks to the substrate, heats a substrate with temperature between 930° C. and 1100° C. again to grow a GaN single crystalline thick layer. Thus, this method requires a longer time than the present invention, and consequently has a lower productivity than the present invention. And, the GaN film of this art has a minimum thickness of 50 μm, but a corresponding crack-created gallium nitride film of the present invention has a minimum thickness between 2.5 μm and 3.5 μm. So, the above-mentioned art requires a longer time than the present invention due to a thick thickness of the GaN film, and thus is less economical than the present invention.

BRIEF DESCRIPTION OF THE DRAWINGS

FIG. 2(a) is a perspective image, and FIG. 2(b) is a microscope image of a surface of the GaN film.

FIG. 4(a) is a photograph taken by focusing on a surface of a gallium nitride single crystalline thick layer, and FIG. 4(b) is a photograph taken by focusing on a crack-created gallium nitride film located directly on a silicon base substrate.

DETAILED DESCRIPTION OF THE INVENTION

Hereinafter, preferred embodiments of the present invention will be described in detail with reference to the accompanying drawings.

Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
FIG. 1 is a cross-sectional view illustrating schematically a process for manufacturing a GaN single crystalline substrate according to the present invention.
Figure 1:
Figure 1:
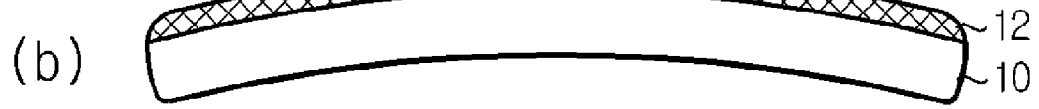
Figure 1:
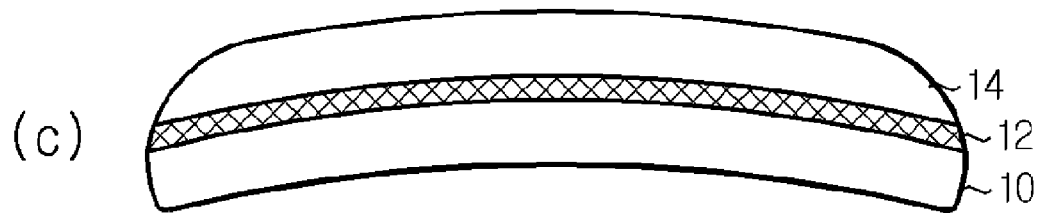
Figure 1:
Figure 1:
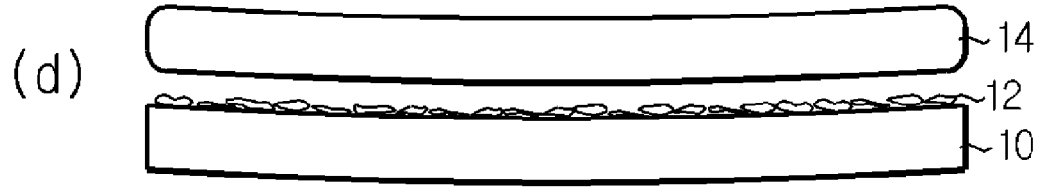

FIG. 1 is a cross-sectional view illustrating schematically a process for manufacturing a GaN single crystalline substrate according to the present invention.

As shown in FIG. 1(a), a base substrate 10 is prepared. The base substrate is made of a material having a smaller coefficient of thermal expansion than GaN for the following reason. The material may be, for example, silicon or silicon carbide. Silicon is used the most widely for a substrate in a general semiconductor process. Silicon is inexpensive, enables production of a large-area wafer and has an excellent thermal conductivity, and thus it is preferable for a base substrate. Further, as mentioned above, the present invention actively utilizes a difference in coefficient of thermal expansion between silicon and GaN, and thus silicon having a plane orientation of {111} is more preferable for a base substrate.

A chemical pre-processing is performed on the base substrate 10. In other words, SC1 clean is performed to remove organic contaminants or microparticles on an upper surface of the base substrate 10. And, in the case of a silicon base substrate, a natural silicon dioxide film on an upper surface of the silicon base substrate is removed using a diluted HF.

Subsequently, as shown in FIG. 1(b), a crack-created GaN film 12 is formed on the base substrate 10. The detailed description is as follows.

First, GaN has a coefficient of thermal expansion of $5.59 \times 10^{-6}$/K, and a lattice constant of 3.1891 Å approximately. Silicon carbide has a coefficient of thermal expansion of $4.2 \sim 4.7 \times 10^{-6}$/K, silicon having a plane orientation of {100} has a coefficient of thermal expansion of $3.7 \times 10^{-6}$/K, and silicon having a plane orientation of {111} has a coefficient of thermal expansion of $2.6 \times 10^{-6}$/K. Accordingly, there is a considerable difference in coefficient of thermal expansion between GaN and a material for a base substrate, for example, a difference of about 16 to 25% between GaN and silicon carbide, a difference of about 34% between GaN and silicon having a plane orientation of {100}, and a difference of about 53% between GaN and silicon having a plane orientation of {111}. If a GaN film is grown directly on a silicon base substrate without a separate buffer layer, the grown GaN film has a considerable density of dislocation defects and stress beyond the limits, thereby resulting in cracks. Thus, the conventional art formed at least one buffer layer on a silicon base substrate or controlled strictly process conditions. However, the present invention does not form a buffer layer nor control process conditions, but forms a GaN film under the conditions vulnerable to cracks.

Specifically, a GaN film is epitaxially grown by MOCVD with a thickness between 2.5 μm and 3.5 μm using flow of TMGa (TriMethylGallium) and $NH_3$ at temperature between 1100° C. and 1200° C. on the base substrate 10 made of a material having a smaller coefficient of thermal expansion than GaN. Then, tensile stress occurs to the base substrate 10 having a relatively smaller coefficient of thermal expansion, and compressive stress occurs to the GaN film 12 having a relatively larger coefficient of thermal expansion, and consequently a bending phenomenon occurs to a stack of the base substrate 10 and the GaN film 12, so that the stack of the base substrate 10 and the GaN film 12 is bent convex downwards. Subsequently, the stack of the base substrate 10 and the GaN film 12 is cooled at room temperature. Then, tensile stress is applied to the base substrate 10, and compressive stress is applied to the GaN film 12, and as a result, the stack of the base substrate 10 and the GaN film 12 is bent convex upwards as shown in FIG. 1(b).

At the same time, multiple cracks are created in the GaN film 12. The cracks run parallel to or slantly relative to the surface of the silicon base substrate 10. The crack-created GaN film 12 is a portion where a substrate is split later. If the GaN film 12 is formed too thin, the GaN film 12 may be etched away or a substrate may be broken during a subsequent process for growing a GaN single crystalline layer 14. Preferably, the GaN film 12 is formed having at least a predetermined thickness. And, the crack-created GaN film 12 is broken and destroyed when a substrate is split, and thus if the GaN film 12 is formed too thick, it is not economical. Therefore, preferably the GaN film 12 is formed having a thickness of the above-mentioned range.

As mentioned above, the present invention utilizes actively a difference in coefficient of thermal expansion between a material for the base substrate 10 and GaN, so that a stack of the base substrate 10 and the GaN film 12 is bent convex upwards, and thus preferably the material for the base substrate 10 has a smaller coefficient of thermal expansion than GaN and has a large difference in a coefficient of thermal expansion with GaN. Accordingly, preferably the base substrate 10 is made of silicon carbide or silicon, and more preferably a silicon having a plane orientation of {111}.

Subsequently, as shown in FIG. 1(c), a GaN single crystalline thick layer to be used as a material for, for example, a light emitting device is grown on the stack of the base substrate 10 and the GaN film 12.

Specifically, the stack of the base substrate 10 and the GaN film 12 shown in FIG. 1(b) is loaded onto a HVPE equipment, and a relatively thick GaN single crystalline layer 14 is grown at temperature between 990° C. and 1030° C. using GaN gas produced by reacting gallium metal and HCl gas and $NH_3$ gas as a source. In the case that the growth temperature is less than 990° C., a propagation length of a gallium atom is reduced, and thus vacancy-type defects are generated due to lack of gallium and a growth rate is reduced, which may exhibit a polycrystalline phase. In the case that the growth temperature is more than 1030° C., an etching phenomenon occurs to the surface of a GaN layer and a reaction between GaCl gas and $NH_3$ gas is not good, which results in dark agglomeration of gallium on the surface of a substrate. Therefore, it is preferable to set the growth temperature to the above-mentioned range. And, the GaN single crystalline layer 14 is not limited to a specific thickness, however, it is found that when the GaN single crystalline layer 14 has a thickness of 50 μm or more, self-split occurs between the GaN single crystalline layer 14 and the base substrate 10 in a subsequent cooling process. Thus, preferably a minimum thickness of the GaN single crystalline layer 14 is about 50 μm. Meanwhile, in practice, the GaN single crystalline layer 14 is used as a material for a light emitting device, and thus, as the GaN single crystalline layer 14 is thicker, it is the better. However, as the GaN single crystalline layer 14 is grown thicker, the GaN single crystalline layer 14 is bent more severely, which results in breakage of a substrate. It is preferable to grow the GaN single crystalline layer 14 to a thickness of 300 μm or less.

Subsequently, after the GaN single crystalline layer 14 is grown to a desired thickness, a substrate is unloaded and cooled up to room temperature. Then, the substrate becomes flat as shown in FIG. 1(d) or is bent convex downwards in this cooling process due to a difference in coefficient of thermal expansion between GaN and a material for the base substrate 10. That is, stress of the GaN single crystalline layer 14 pulls the convex upward substrate down in the direction of c-axis of GaN, so that the substrate becomes flat or is bent convex downwards. At this time and the crack-created GaN film 12 is broken into pieces 12'. As a result, the base substrate 10 and GaN single crystalline layer 14 are self-split from each other, so that a free-standing gallium nitride single crystalline substrate is obtained. The obtained gallium nitride single crystal is processed, for example, each surface is polished, and is used as a substrate of a light emitting device and so on.

Subsequently, the effect of the present invention is verified through a specific example.

In this example, a silicon wafer 10 having a plane orientation of {111} and 2-inch diameter is prepared as a base substrate. A GaN film 12 of 2.5 μm thickness is epitaxially grown at 1200° C. using an MOCVD equipment, and then is cooled up to room temperature (At this time, a separate cooling process is not performed, but the silicon wafer 10 having the grown GaN film 12 is unloaded from the MOCVD equipment, left as it is and naturally cooled). As a result, as shown in FIG. 2, a substrate is deformed, for example bent convex upwards, and cracks are created in the grown GaN film 12.

Figure 2:
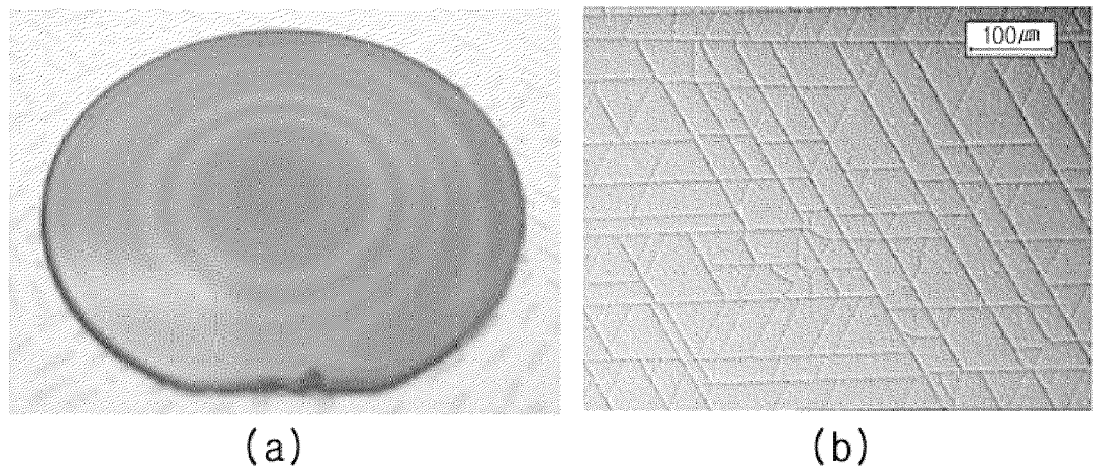
FIG. 2 is a photograph of a GaN film grown on a silicon base substrate according to an embodiment of the present invention (corresponding to FIG. 1(b))

Subsequently, the substrate shown in FIG. 2 is loaded onto a HVPE equipment, and the GaN single crystalline layer 14 of 100 μm thickness is grown at 1020° C.

Figure 3:
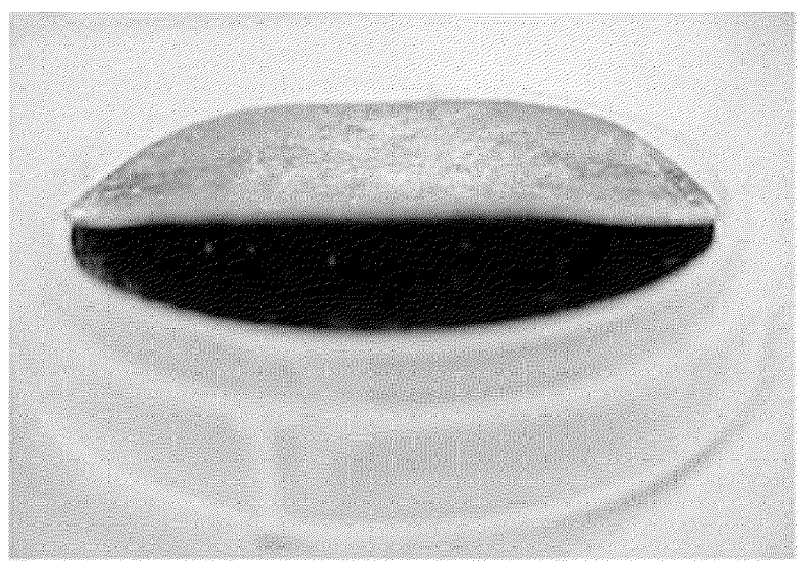
FIG. 3 is a photograph of self-split between a silicon base substrate and a gallium nitride single crystalline layer when growing and cooling the gallium nitride single crystalline thick layer (corresponding to FIG. 1(d)).

Subsequently, the substrate having the GaN single crystalline thick layer 14 is unloaded from the HVPE equipment and naturally cooled down to room temperature. Then, as shown in FIG. 3, the silicon base substrate 10 and the GaN single crystalline layer 14 are naturally self-split from each other.

Figure 4:
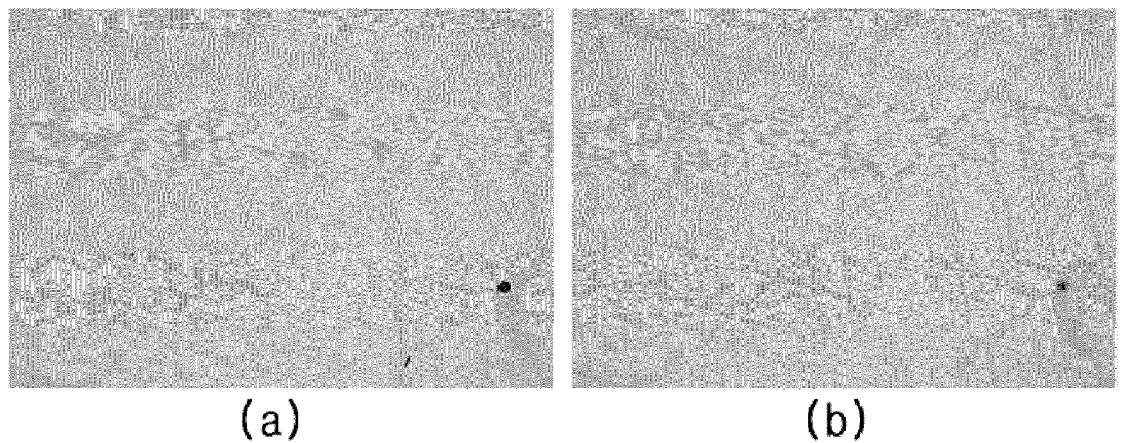
FIG. 4 is a microscope image of an unsplit portion of a gallium nitride single crystalline substrate manufactured according to an embodiment of the present invention.

FIG. 4 is a microscope image of an unsplit portion of the gallium nitride single crystalline layer 14 of 100 μm thickness grown according to this example. FIG. 4(a) is a surface image of the GaN single crystalline layer 14, and FIG. 4(b) is a surface image of the crack-created GaN film 12 beneath the GaN single crystalline layer 14. As shown in FIG. 4(b), cracks are created in the GaN film 12 only. In FIG. 4, a black spot is a defect formed on the surface of the GaN single crystalline layer 14 due to lack of gallium. The black spot was intentionally included in the image for the purpose of easy focusing on the surface of the GaN single crystalline layer 14 and the surface of the GaN film 12 as shown in FIGS. 4(a) and (b), respectively.

Figure 5:
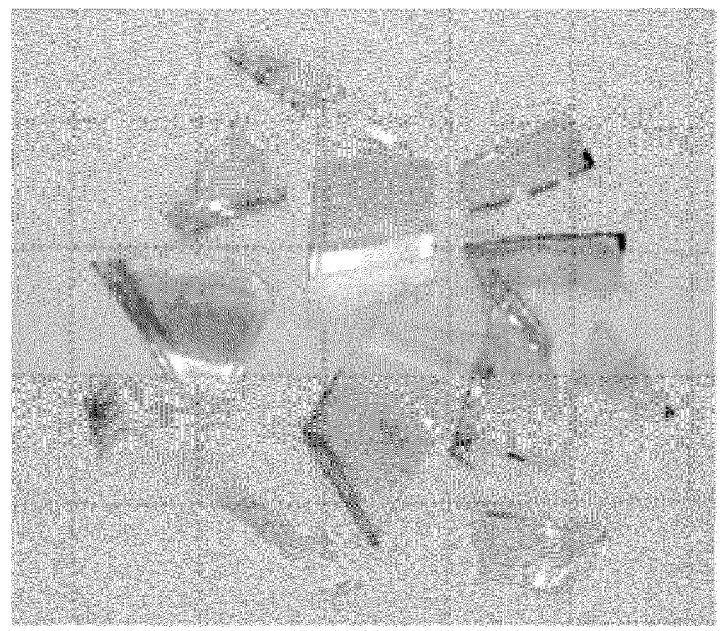
FIG. 5 is a photograph of a free-standing gallium nitride single crystal obtained according to an embodiment of the present invention.

FIG. 5 is a photograph of a free-standing GaN single crystal obtained as mentioned above. According to this example, a GaN single crystalline substrate can be obtained having an area about half as much as a substrate of 2-inch diameter, and at this time, if a defect portion is excluded, a GaN single crystalline substrate can be obtained having an area about ⅙ as much as a substrate of 2-inch diameter. Therefore, the present invention can obtain a free-standing GaN single crystal that is sufficiently useful in practice.

It should be understood that the detailed description and specific examples, while indicating preferred embodiments of the invention, are given by way of illustration only, since various changes and modifications within the spirit and scope of the invention will become apparent to those skilled in the art from this detailed description.

For example, although the above-mentioned embodiment shows the crack-created GaN film 12 is grown by MOCVD and the GaN single crystalline thick layer 14 is grown by HVPE, the GaN film 12 and the GaN single crystalline layer 14 may be formed using techniques known well in the art, such as MBE (Molecular Beam Epitaxy). However, preferably the GaN film 12 and the GaN single crystalline layer 14 are grown using different methods for easy splitting. Preferably, the GaN single crystalline layer 14 that is relatively thicker than the GaN film 12 is grown by HVPE of a higher growth rate.

And, although the above-mentioned embodiment shows a silicon wafer having a plane orientation of {111} as the base substrate 10, however a silicon wafer having a plane orientation of {100} or silicon carbide may be used as the base substrate 10 within the spirit and scope of the invention, which leads to the same results.

The effects of the present invention are as follows.

First, the present invention utilizes actively a difference in coefficient of thermal expansion between a material for a base substrate and GaN to bend the base substrate and create cracks in a GaN film, and as a result, a GaN single crystalline layer and the base substrate are naturally split from each other with the crack-created GaN film interposed therebetween.

Thus, the present invention eliminates the need of a buffer layer, or laser lift-off or mechanical polishing, and thus can easily obtain a free-standing GaN single crystalline substrate without additional costs.

And, the present invention uses as a base substrate a silicon substrate having large differences in coefficient of thermal expansion and lattice constant with GaN, and thus can easily manufacture a large-area GaN single crystalline substrate at low costs.

What is claimed is:

1. A method for manufacturing a gallium nitride single crystalline substrate, comprising:
    (a) growing a gallium nitride film on a flat base substrate made of a material having a smaller coefficient of thermal expansion than gallium nitride and cooling the gallium nitride film to bend convex upwards the base substrate and the gallium nitride film and at the same time create cracks in the gallium nitride film;
    (b) growing a gallium nitride single crystalline layer on the crack-created gallium nitride film located on the convex upward base substrate; and
    (c) cooling a resultant product having the grown gallium nitride single crystalline layer to make the convex upward resultant product flat or bend convex downwards the convex upward resultant product and at the same time to self-split the base substrate and the gallium nitride single crystalline layer from each other at the crack-created gallium nitride film interposed therebetween.

2. The method for manufacturing a gallium nitride single crystalline substrate according to claim 1, wherein the base substrate is made of silicon or silicon carbide.

3. The method for manufacturing a gallium nitride single crystalline substrate according to claim 1, wherein the base substrate is a silicon substrate having a plane orientation of {111}.

4. The method for manufacturing a gallium nitride single crystalline substrate according to claim 1, wherein, in the step (a), the gallium nitride film is grown to a thickness between 2.5 µm and 3.5 µm by MOVCD (Metal Organic Chemical Vapor Deposition).

5. The method for manufacturing a gallium nitride single crystalline substrate according to claim 4, wherein the base substrate is made of silicon or silicon carbide.

6. The method for manufacturing a gallium nitride single crystalline substrate according to claim 4, wherein the base substrate is a silicon substrate having a plane orientation of {111}.

7. The method for manufacturing a gallium nitride single crystalline substrate according to claim 1, wherein the cracks created in the gallium nitride film in the step (a) run parallel to a surface of the base substrate or slantly relative to the surface of the base substrate.

8. The method for manufacturing a gallium nitride single crystalline substrate according to claim 7, wherein the base substrate is made of silicon or silicon carbide.

9. The method for manufacturing a gallium nitride single crystalline substrate according to claim 7, wherein the base substrate is a silicon substrate having a plane orientation of {111}.

10. The method for manufacturing a gallium nitride single crystalline substrate according to claim 1, wherein, in the step (b), the gallium nitride single crystalline layer is grown to a thickness between 50 µm and 300 µm by HVPE (Hydride Vapor Phase Epitaxy).

11. The method for manufacturing a gallium nitride single crystalline substrate according to claim 10, wherein the base substrate is made of silicon or silicon carbide.

12. The method for manufacturing a gallium nitride single crystalline substrate according to claim 10, wherein the base substrate is a silicon substrate having a plane orientation of {111}.

13. The method for manufacturing a gallium nitride single crystalline substrate according to claim 10, wherein the step (b) is performed at temperature between 990° C. and 1030° C.

14. The method for manufacturing a gallium nitride single crystalline substrate according to claim 13, wherein the base substrate is made of silicon or silicon carbide.

15. The method for manufacturing a gallium nitride single crystalline substrate according to claim 13, wherein the base substrate is a silicon substrate having a plane orientation of {111}.

* * * * *